(12) United States Patent
Furusawa (10) Patent No.: US 6,734,029 B2
(45) Date of Patent: May 11, 2004

(54) METHOD FOR FORMING CONDUCTIVE FILM PATTERN, AND ELECTRO-OPTICAL DEVICE AND ELECTRONIC APPARATUS

(75) Inventor: Masahiro Furusawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/896,930

(22) Filed: Jun. 29, 2001

(65) Prior Publication Data
US 2002/0151161 A1 Oct. 17, 2002

(30) Foreign Application Priority Data

Jun. 30, 2000 (JP) ..................................... P2000-199367
Jun. 29, 2001 (JP) ..................................... P2001-197801

(51) Int. Cl.$^7$ .............................................. H01L 21/00
(52) U.S. Cl. ........................................ 438/22; 438/715
(58) Field of Search ........................ 438/22, 200, 688, 438/778, 785, 747, 715, 782

(56) References Cited

U.S. PATENT DOCUMENTS 5,726,456 A * 3/1998 Lupton et al.
5,784,129 A * 7/1998 Konuma et al.

* cited by examiner

*Primary Examiner*—Phuc T. Dang
(74) *Attorney, Agent, or Firm*—Harness, Dickey & Pierce, P.L.C.

(57) ABSTRACT

A method for forming a high quality conductive film pattern having an accuracy on the order of microns by simple steps is provided. A lyophilic region and a lyophobic region are formed on a predetermined pattern using an organic molecular film on a surface of a substrate, and after a solution dispersed with conductive fine particles is selectively applied to the lyophilic region, the solution applied to the lyophilic region is converted into a conductive film by a heat treatment, and a conductive film is formed on only the lyophilic region.

9 Claims, 6 Drawing Sheets

METHOD FOR FORMING CONDUCTIVE FILM PATTERN, AND ELECTRO-OPTICAL DEVICE AND ELECTRONIC APPARATUS

BACKGROUND OF THE INVENTION

1. Field of the Invention

The present invention relates to a method for forming a conductive film pattern used for an electronic circuit or an integrated circuit, an electro-optical device produced using this method for forming a conductive film pattern, and an electronic apparatus having the electro-optical device.

2. Description of Related Art

As a conventional method for forming a conductive film pattern used for wiring, a method of forming a metal thin film on the entire surface of a substrate using sputtering, vapor deposition, or the like, and etching the undesired portions using photolithography in order to form a desired conductive film pattern, is the most general method. However, this method has complex processes, requires an expensive vacuum apparatus, and since the material usage efficiency is a few percent, almost all the material is discarded. Therefore, an easier method with a lower cost than the conventional method has been required.

On the other hand, U.S. Pat. No. 5,132,248 suggests a method of direct pattern application of a liquid in which fine particles are dispersed onto a substrate using an ink jet method and then converting into a conductive film pattern by heat treatment or laser irradiation. According to the above method, photolithography is not required and processes become much easier. Such patterning using an ink jet method has merits of having simple processes and the amount of raw materials to be used is small; however, if a bank (to be explained below) is not used, it is limited to forming a pattern having a size of approximately 100 $\mu$m with a positioning accuracy of approximately 30 $\mu$m. In order to improve the processing accuracy using the ink jet method, as disclosed in Japanese Unexamined Patent Application, First Publication, No. Sho 59-75205, a method is used which controls the location of droplets which are jetted out by providing a bank on a substrate. If the bank is used, without discharging droplets, which are jetted out onto the substrate, out of the bank, and a pattern of approximately 30 $\mu$m can be formed with a positioning accuracy of approximately 1 $\mu$m. However, such a bank requires forming by the use photolithography, and therefore, its cost becomes high.

Furthermore, in order to apply this to LSI and the like, a method for spin-coating a solution in which copper particles are dispersed in a solvent onto a substrate has been suggested in recent years (Hirohiko Murakami, et al., Preliminary Report No. 2 of the Spring 1999, 46th Japan Society of Applied Physics Academic Lecture Meeting, page 29, ZQ-15). When this method is used, a pattern of a copper thin film is obtained by pouring the solution into trenches and holes prepared on the substrate, and drying and heating the substrate. However, to form the trenches and holes, it is required to use photolithography.

As described above, when a conductive film pattern is formed by forming a film from a liquid material and patterning the film, so far, there has been no patterning means which has an accuracy on the order of microns, and which obtains a conductive film pattern by a simple process without using photolithography.

BRIEF SUMMARY OF THE INVENTION

In a method for forming a conductive film pattern by pattern applying a solution comprising fine particles onto a substrate, the present invention provides a method for forming a conductive film pattern with high accuracy and simple processes by, selectively applying a liquid material to only lyophilic regions on the substrate on which patterns of lyophobic regions and lyophilic regions are formed using an organic molecular film, and then converting the liquid material applied onto the lyophilic regions into a conductive film pattern by heat treatment, without controlling the location of droplets in a bank or a trench formed by photolithography as is done in the a conventional method.

In order to solve the above problems, the present inventors have diligently carried out research and have found that by a method for forming a conductive film pattern, comprising the steps of: forming a predetermined pattern comprising a lyophilic region and a lyophobic region using an organic molecular film on a substrate surfaces; selectively applying a solution comprising conductive fine particles to the lyophilic region on the substrate; and converting the applied film of the solution into a conductive film by a heat treatment, it is possible to form an accurate conductive film with an easy process.

According to the present invention, photolithography and etching steps such as development, rinsing, and the like are not required, and it is possible to provide a patterning technique for conductive films having an accuracy on the order of microns by simple process.

DETAILED DESCRIPTION OF THE INVENTION

Various materials such as an Si wafer, quartz glass, glass, a plastic film, a metal plate, and the like can be used for a substrate used in the present invention, and furthermore, there is no problem if a semiconductor film, a metal film, a dielectric film, an organic film, or the like is formed on the surface of the substrate as an undercoat layer.

The organic molecular film of the present invention comprises functional groups capable of bonding to the substrate, functional groups at the opposite side of the above functional groups such as a lyophilic group and a lyophobic group for modifying a property of the surface of the substrate (controlling the surface energy), and a linear chain of carbon or a carbon chain in which a portion is branched for bonding these functional groups. The functional groups which are capable of bonding to the substrate, bond to the substrate, and these functional groups and carbon chains self-organize to form a molecular film, for example, a monomolecular film. Furthermore, it is desirable that this organic molecular film is decomposed by UV irradiation, and also a patterning is easily carried out by UV irradiation which uses a mask.

The self-organizing film formed on the surface of the substrate in the present invention is a film comprising atoms of an undercoat layer of the substrate and the like, bonding groups which are capable of reacting, and linear chain molecules other than the bonding groups, and is formed by orienting a compound having an extremely high orientability due to the interaction between the linear chain molecules. Since the self-organizing film differs from a resin film such as a photoresist material and is formed by orienting monomolecules, the thickness of the film can be made remarkably thin and also becomes a homogenous film at the molecular level. That is, since the same molecules are positioned at the surface of the film, a uniform and superior lyophobic property and lyophilic property can be provided at the surface of the film, and it is particularly useful when carrying out fine patterning.

When fluoroalkyl silane (explained below), for example, is used as the above-mentioned compound having high orientability, each compound is oriented to form a self-organizing film so as to position the fluoroalkyl groups at the surface of the film, therefore, a uniform lyophobic property is provided at the surface of the film.

Examples of the compounds forming the above self-organizing film include fluoroalkylsilane (called "FAS" below) such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, trifluoropropyltrimethoxysilane, and the like. During use, one compound is preferably used alone, however, two or more kinds of compounds may be used in combination, and it is not limited to this as long as it does not depart from the object of the present invention. Furthermore, in the present invention, FAS as described above is preferably used as the compound which forms the self-organizing film in order to provide adhesiveness and an excellent lyophobic property to the substrate. A pattern of a lyophilic region and a lyophobic region can be formed by patterning FAS. The part which is FAS is the lyophobic region.

FAS used here is generally represented with the structural formula $R_nSiX_{(4-n)}$, herein n represents an integer of 1 to 3; X represents a hydrolyzable group such as a methoxy group, an ethoxy group, a halogen atom, and the like; and R represents a fluoroalkyl group having a structure of $(CF_3)(CF_2)_x(CH_2)_y$ (x represents an integer of 0 to 10, and y represents an integer of 0 to 4). If plurality of R or X are bonded to Si, then each R or X may have the same structure or may have different structures. The hydrolyzable group represented by X is converted into silanol by hydrolysis, reacts with the hydroxyl group in the undercoat of the substrate (glass and silicon) and the like, and bonds to the substrate by forming a siloxane bond. Conversely, since R has a fluoro group such as $(CF_3)$ on its surface, the surface of the undercoat of the substrate and the like is modified to an unwettable surface (surface energy is low).

Next, the lyophilic region will be explained below. A region in which the self-organizing film was removed by UV rays or the like (explained below) has hydroxyl groups on its surface. As a result, this shows a property of being extremely easy to wet in comparison with the FAS region. Therefore, if a part of the FAS region is removed after forming FAS on the entire surface of the substrate, that region shows a lyophilic property, so that a pattern comprising a lyophilic region and a lyophobic region is formed.

Furthermore, a second self-organizing film can be formed on the region in which FAS was removed as described above. Compounds forming the second self-organizing film comprise, in the same way as FAS, bonding functional groups and the functional groups which modify the surface, and the bonding functional groups bond to hydroxyl groups at the surface of the substrate to form the self-organizing film. As the functional groups which modify the surface of the second self-organizing film, groups showing lyophilic property different from FAS, or those with a high bonding strength to fine particles, for example, amino groups, thiol groups, and the like, are preferably used. Accordingly, stable patterning becomes possible, and therefore, adhesiveness to the substrate of the conductive film pattern finally obtained is improved. Compounds forming the second self-organizing film include 3-mercaptopropyltriethoxysilane, 3-mercaptopropyltrimethoxysilane, 3-aminopropyltriethoxysilane, 3-aminopropyltrimethoxysilane, and the like.

The self-organizing film is disclosed in detail in "An Introduction to ULTRATHIN ORGANIC FILMS: Ulman, ACADEMIC PRESS", for example.

In the present invention, after the predetermined pattern comprising a lyophilic region and a lyophobic region is formed on the substrate using the organic molecular film as described above, the solution comprising fine particles is selectively applied to the lyophilic region on the substrate, and then the coating film is converted into a conductive film by a heat treatment.

Examples of the fine particles used here include fine particles of a conductive polymer or a superconductive material as well as metal fine particles comprising any of gold, silver, copper, palladium, or nickel. In the present invention, a solution made by dispersing these fine particles in a solvent is used. In order to disperse the fine particles, the surface of the fine particles may be coated with organic matter or the like. Furthermore, when applying to the substrate, in view of high dispersibility to the solvent and application of an ink jet method, the fine particles preferably have a diameter of from 50 nm to 0.1 µm.

The above-mentioned solution made by dispersing the fine particles in the solvent is selectively applied to only the lyophilic region on the substrate. The solvent to be used preferably has a vapor pressure of 0.001 to 200 mmHg at room temperature. If the vapor pressure is higher than 200 mmHg, the solvent will vaporize beforehand when a coating film is formed, and therefore, it is difficult to form a satisfactory coating film. Conversely, if the solvent has a vapor pressure lower than 0.001 mmHg at room temperature, drying is slow, the solvent tends to remain in the coating film, and it is difficult to obtain a high quality conductive film after heat treatment and/or light treatment is carried out as a post-treatment. Furthermore, when the solution is applied using an ink jet device, it is desirable that the solvent has a vapor pressure of 0.001 to 50 mmHg. If the vapor pressure is higher than 50 mmHg, when droplets are jetted out from the ink jet device, nozzle clogging caused by drying tends to occur, and it becomes difficult to stably spray (jet out) droplets. Conversely, if the vapor pressure is lower than 0.001 mmHg, since drying of the sprayed ink is slow, the solvent tends to remain in the coating film, and it is difficult to obtain a high quality conductive film after heat treatment is carried out as a post-treatment.

The solvent used for the present invention is not particularly limited as long as the solvent can disperse fine particles and does not cause agglomeration. Besides water, examples of the solvent include: alcohols such as methanol, ethanol, propanol, and butanol; hydrocarbon solvents such as n-heptane, n-octane, decane, toluene, xylene, cymene, durene, indene, dipentene, tetrahydronaphthalene, decahydronaphthalene, and cyclohexylbenzene; ethers such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1,2-dimethoxyethane, bis(2-methoxyethyl) ether, and p-dioxane; and polar solvents such as propylene carbonate, δ-butyrolactone, N-methyl-2-pyrolidone, dimethylformamide, dimethylsulfoxide, and cyclohexanone. Among these, in view of the dispersibility of the fine particles, the stability of the dispersion solution, and the ease of application to the ink jet method, water, alcohols, hydrocarbon solvents, and ethers are preferably used, and particularly, water and hydrocarbon solvents are more preferably used. These solvents can be used either alone or as a mixture of two or more compounds.

The solute concentration when the above fine particles are dispersed in the solvent is 1to 80% by weight and can be adjusted according to the film thickness of the desired conductive film. If the solute concentration exceeds 80% by weight, agglomeration is easily generated, and a uniform coating film cannot be obtained.

If necessary, a very small amount of a surface tension adjusting material such as fluorine, silicones, nonions, and the like can be added to the above-mentioned fine particle dispersion solution used in the present invention without deteriorating the objective functions. This nonionic surface tension adjusting material is useful in that the adjusting material makes the wettability to the applied object of the solution satisfactory, improves the levelling property of the applied film, and prevents the generation of unevenness and an orange peel.

The viscosity of the fine particle dispersion solution prepared as described above is preferably 1 to 50 mPa·s. When the solution is applied by the ink jet device to be explained below, if the viscosity is lower than 1 mPa·s, the periphery of a nozzle is easily contaminated by the outflow of ink, and if the viscosity is higher than 50 mPa·s, the frequency of clogging at the nozzle opening increases, and it becomes difficult to smoothly spray droplets.

Furthermore, the surface tension of the fine particle dispersion solution prepared as described above is desirably 20 to 70 dyn/cm. When the solution is applied by the ink jet device to be explained below, if the surface tension is lower than 20 dyn/cm, since the wettability of the ink composition with respect to the surface of the nozzle increases, the ink composition tends to deflect while being sprayed, and if the surface tension is higher than 70 dyn/cm, since the shape of the meniscus at the tip of the nozzle is not stable, controlling the spray amount of the ink composition and the timing of the spraying becomes difficult.

Moreover, the electro-optical device of the present invention is characterized in having a conductive film pattern formed by the method for forming a conductive film pattern of the present invention as described above.

Furthermore, the electronic apparatus of the present invention is characterized in being provided with the above-mentioned electro-optical device of the present invention.

A typical method of forming the conductive film pattern of the present invention will be explained with reference to the figures as follows.

Forming a conductive film pattern is carried out through the steps of: (1) a pattern forming step of forming a self-organizing film 12 on the whole surface of a substrate 11, thereafter partially removing the self-organizing film 12, and forming a lyophilic region 11a and lyophobic region 11b in a predetermined pattern; (2) a step of applying a fine particle dispersion solution 14 selectively to the lyophilic region 11a using a spin-coating method or an ink jet method; and (3) a step of converting the applied fine particle dispersion solution into a conductive film 16 by a heat treatment.

(1) Forming Steps of the Lyophobic Region and the Lyophilic Region Pattern

Figure 1:
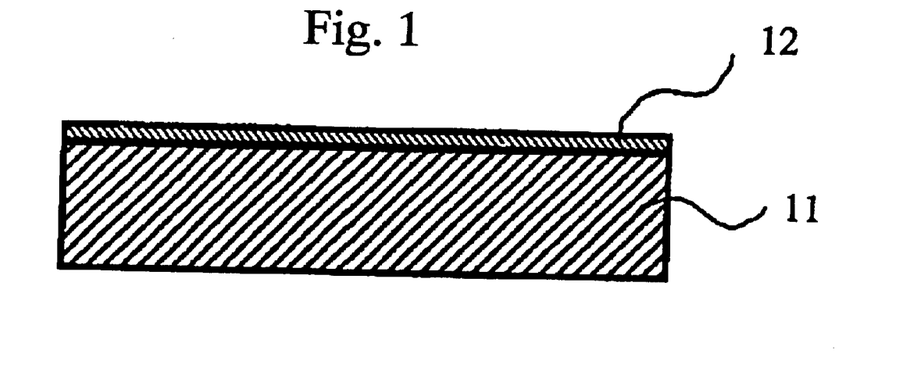
FIG. 1 is a cross-sectional view of a self-organizing film formed on a substrate.

First, as shown in FIG. 1, the self-organizing film 12 composed of the above-mentioned FAS and the like is formed on the surface of the substrate 11. The self-organizing film 12 is formed on a substrate by putting a raw material (for example, heptadecafluoro-1,1,2,2-tetrahydrodecyltriethoxysilane) as described above and the substrate into the same sealed container and left to stand for two or three days at room temperature. Furthermore, by maintaining the sealed container at approximately 100° C., the self-organizing film 12 is formed on the substrate in three hours. The above is a forming method from a gaseous phase, but the self-organizing film can also be formed from a liquid phase. For example, a self-organizing film can be obtained on a substrate by soaking the substrate in a solvent comprising a raw material, washing the soaked substrate, and drying the washed substrate.

Figure 2:
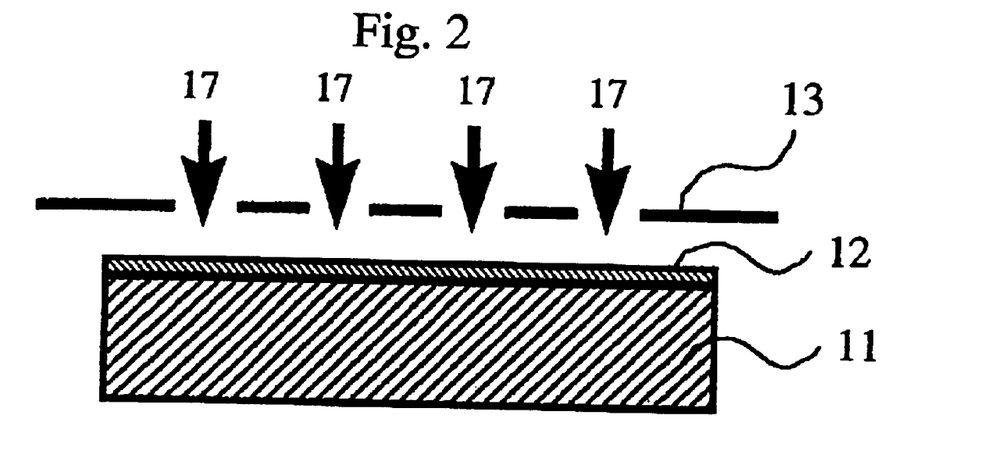
FIG. 2 is a cross-sectional view showing a step of patterning of a self-organizing film.
Figure 3:
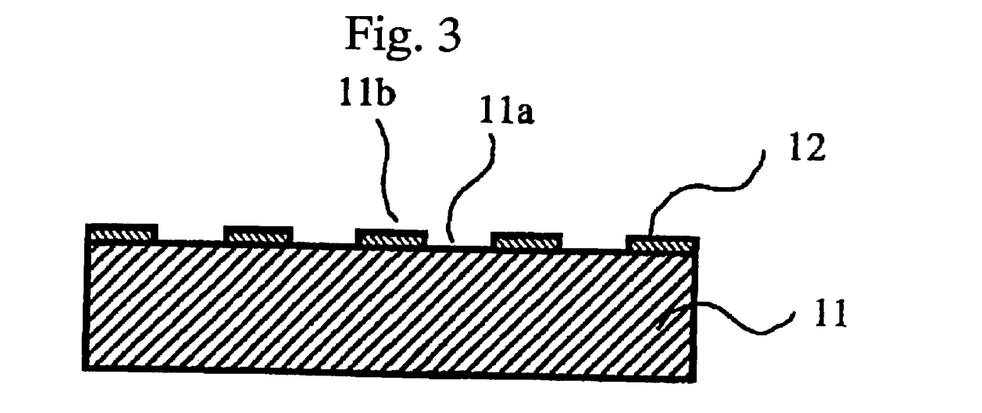
FIG. 3 is a cross-sectional view showing a state in which a self-organizing film is patterned.

Next, as shown in FIG. 2, patterning of the self-organizing film 12 is done according to the conductive film pattern to be formed later. Exposed parts on the surface of the substrate become lyophilic regions 11a having wettability with respect to liquid materials, and the remaining parts of the self-organizing film become lyophobic regions 11b having no wettability with respect to liquid materials.

As a patterning method of the self-organizing film, a UV irradiation method, an electron beam irradiation method, an X-ray irradiation method, a scanning probe microscopy (SPM) method, and the like can be applied. In the present invention, the UV irradiation method is preferably used. The UV irradiation method is carried out by radiating ultraviolet rays 17 having a predetermined wavelength onto the self-organizing film 12 through a photomask 13 comprising apertures for forming the conductive film pattern, as shown in FIG. 2. As described above, by radiating ultraviolet rays, molecules composing the self-organizing film 12 are decomposed and removed, and patterning is carried out. Therefore, in the UV irradiation method, the pattern of the lyophilic region and lyophobic region can be respectively formed according to a pattern formed on the photomask.

The wavelength and irradiation time of the ultraviolet rays to be adopted are suitably determined according to the raw material of the self-organizing film, however, when FAS is used, ultraviolet rays having a wavelength of 310 nm or less are preferably used, and more preferably, ultraviolet rays having a wavelength of 200 nm or less are used.

Furthermore, before forming the self-organizing film on the whole surface of the substrate at first, a pretreatment, such as radiating ultraviolet rays on the surface of the substrate or washing by the solvent, is desirably carried out.

Furthermore, according to necessity, the second self-organizing film is formed on only the lyophilic region of the substrate having a pattern of a lyophilic region and a lyophobic region formed as described above so as to be able to improve the lyophilic property and the adhesiveness of the substrate and the fine particles even more. In order to form the second self-organizing film, for example, a substrate, on which a pattern of a lyophilic region and a lyophobic region are formed, is soaked in a 2% ethanol solution of 3-mercaptopropyltriethoxysilane for five minutes. As a result, the second self-organizing film having thiol groups on its surface is formed on only the lyophilic region.

(2) Selective Application Step of the Fine Particle Dispersion Solution

Figure 4:
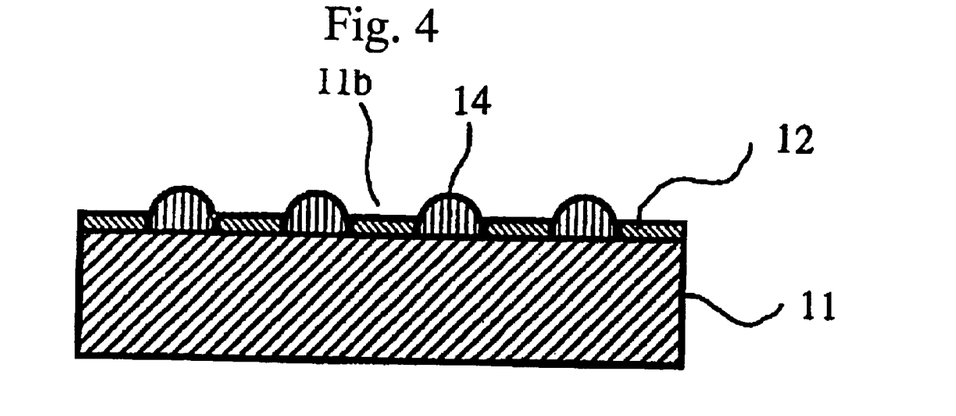
FIG. 4 is a cross-sectional view showing a state in which a fine particle dispersion solution is applied only to a lyophilic region on the substrate.
Figure 5:
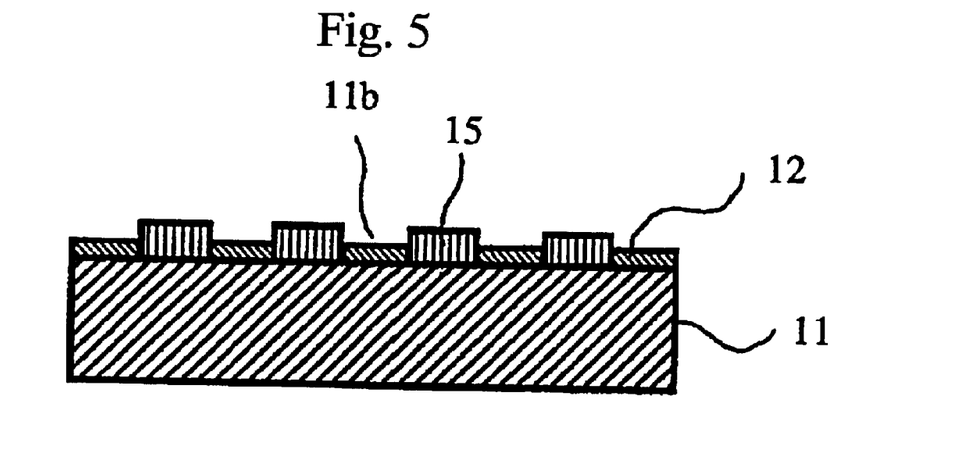
FIG. 5 is a cross-sectional view of a coating film formed on the lyophilic region after drying of the solution.
Figure 6:
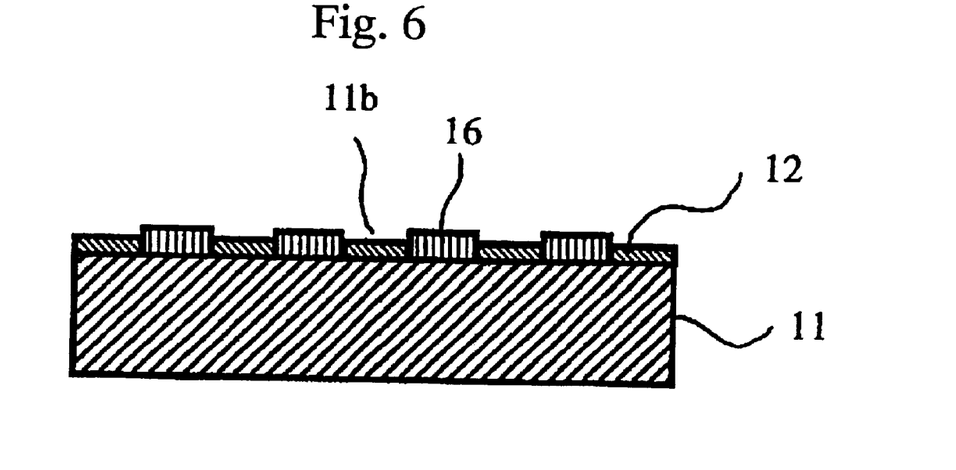
FIG. 6 is a cross-sectional view of a conductive film formed by heat treatment of the coating film made from the fine particle dispersion solution.

Next, the fine particle dispersion solution is selectively applied to only the lyophilic region 11a of the substrate on which the self-organizing film is formed with patterning (coating film 15 of the fine particle dispersion solution). Examples of the coating method to be used include a spin-coating method, a roll-coating method, a curtain coating method, a dip coating method, a spraying method, an ink jet method, and the like. When the spin-coating method is used, the number of revolutions of a spinner is determined according to the required film thickness of the conductive film, the concentration and viscosity of the solid content of the fine particles dispersion solution, and the like, however, in general, it is 100 rpm to 5000 rpm, and preferably, 300 rpm to 3000 rpm.

Furthermore, as the coating method of the fine particle dispersion solution of the present invention, the ink jet method is, in particular, preferably used because only the required amount can be applied to only the lyophilic region 11a. As a result, different from the spin-coating method, the film thickness is easy to control by controlling the spray amount, and a film composed of differing film thicknesses and fine particle composed of differing materials can be formed at differing regions on the substrate. Furthermore, since the fine particle dispersion solution is applied to only the required regions, there is a merit in that the amount of material to be used can be small. Moreover, a pattern of a lyophilic region and a lyophobic region on the substrate exerts an effect in the same way as a bank formed by photolithography, and therefore, droplets jetted out by the ink jet method onto the lyophilic region do not leave the lyophilic region, and each position can be precisely controlled.

The ink jet type droplet jetting out device used in the present invention may have any structure as long as a constant amount of any kind of droplets can be jetted out. Particularly, for example, an ink jet type which uses a piezoelectric element and can form and jet out droplets of several tens of nanograms, a bubble jet type in which bubbles are generated by using the thermal energy of a heater, and the like may be used; however, any type can be adopted. Furthermore, according to necessity, general coating types such as the above-mentioned spin-coating, dip coating, spray coating, roll-coating, curtain coating, and the like may be combined.

(3) Step of Converting the Coating Film into a Conductive Film by Heat Treatment The substrate, to which the fine particle dispersion solution was selectively applied, is heat-treated in order to remove the solvent and to improve the electrical contact between the fine particles. The heat treatment is carried out in a normal atmosphere; however according to necessity, the heat treatment may be carried out in an atmosphere of inert gas such as nitrogen, argon, helium, and the like. The treatment temperature of the above heat treatment may be appropriately set according to the boiling point (vapor pressure) of the solvent, the pressure, and the thermal behavior of the fine particles, and it is not particularly limited; however, a heat treatment is desirably carried out from room temperature up to 300° C. Particularly, in view of using a broad range of substrates made of a material such as plastic and the like, most preferably, the treatment temperature is from room temperature up to 100° C.

Furthermore, the heat treatment can be carried out by lamp annealing as well as by a general hot plate, electric furnace, and the like. The light sources used for lamp annealing are not particularly limited; however, infrared lamps, xenon lamps, YAG lasers, argon lasers, carbon dioxide lasers, and excimer lasers such as XeF, XeCl, XeBr, KrF, KrCl, ArF, ArCl, and the like can be used as the light sources. These light sources generally output 10 to 5000 W; however, usually, 100 to 1000 W is sufficient.

Figure 7:
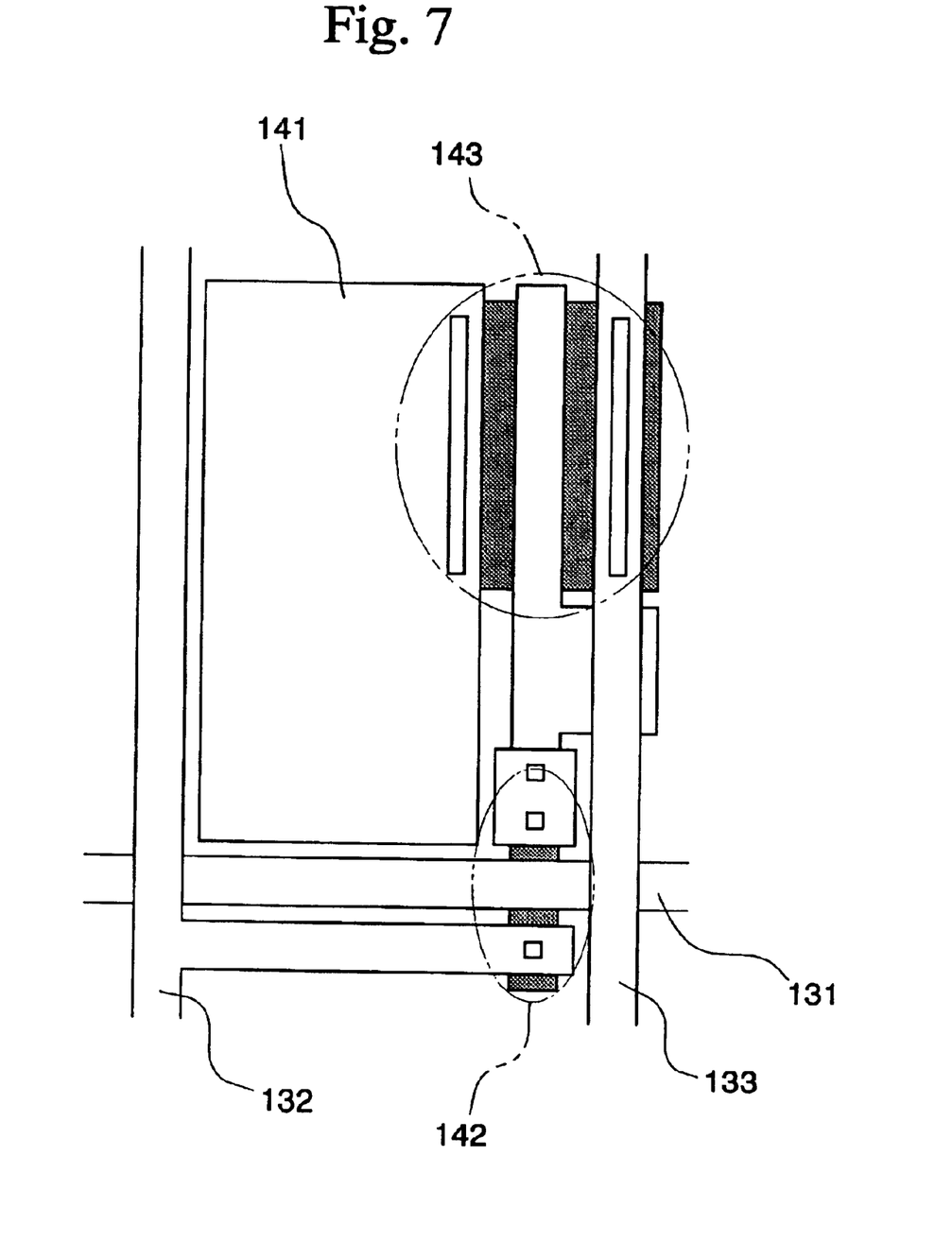
FIG. 7 is a plan view of a matrix display device obtained using a method for a conductive film pattern of the present invention.

FIG. 7 is a plan view showing a part of a matrix display device as an example of an electro-optical device comprising a conductive film pattern obtained using the method for forming a conductive film pattern of the above embodiment.

In FIG. 7, reference symbol 131 is a scanning line, 142 is a first thin film transistor, and 143 is a second thin film transistor. The first thin film transistor 142 transmits an electric potential of a signal line 132 to the second thin film transistor 143 according to the electric potential of the scanning line 131, and the second thin film transistor 143 controls the continuity between a common line 133 and a picture element electrode 141.

In this example of a matrix display device, using the method for forming a conductive film pattern of the above embodiment, wiring patterns of the scanning line 131, the signal line 132, the common line 133, and the like are formed. That is, the pattern of the lyophilic region 11a of the above embodiment is formed according to the patterns of the scanning line 131, the signal line 132, the common line 133, and the like to form these wirings on the lyophilic region 11a.

<Electronic Apparatus>

Next, several examples will be explained which use the matrix display device as an example of the above-mentioned electro-optical device applied to a specific electronic apparatus.

(1) Mobile Computer

Figure 8:
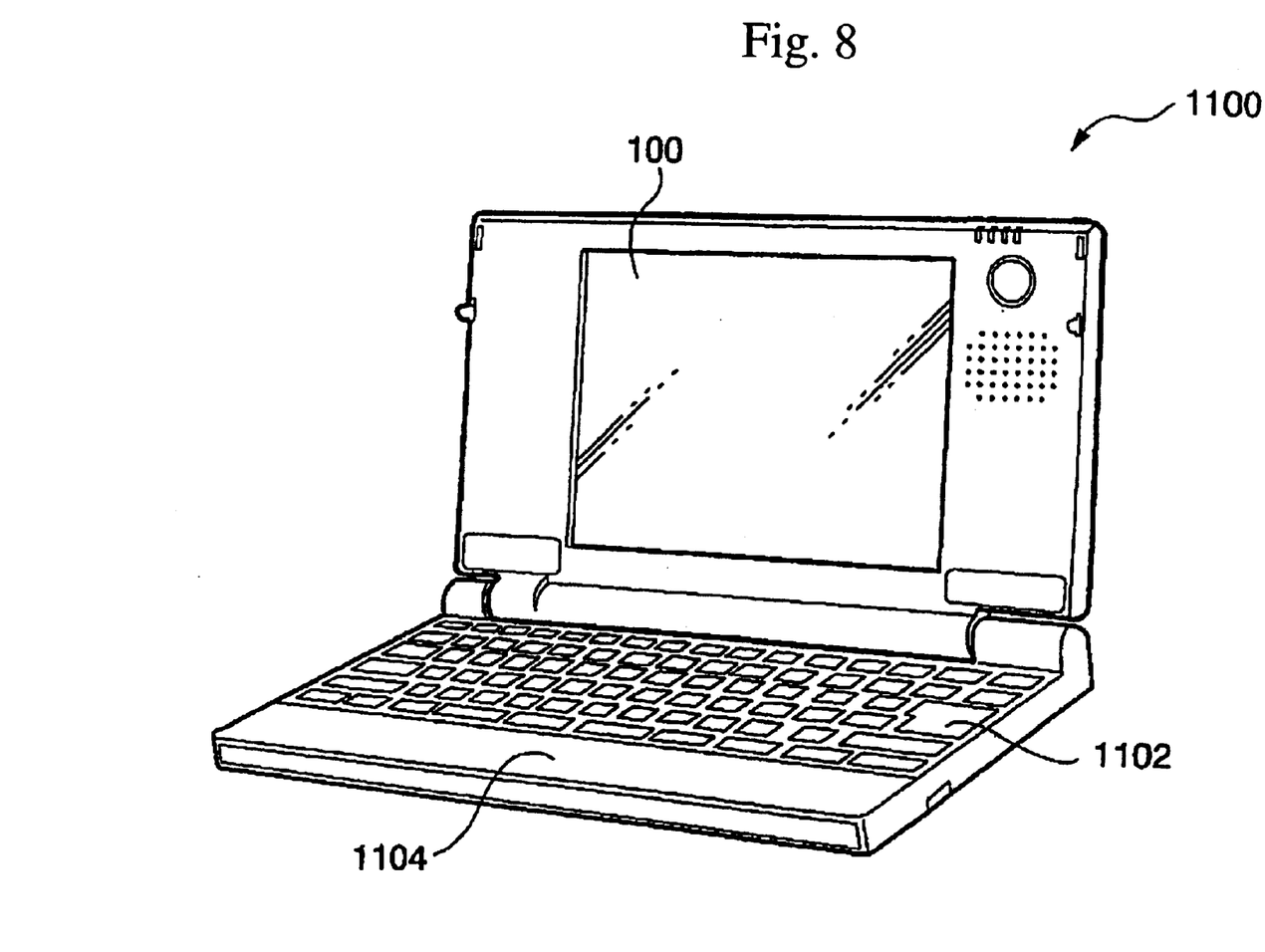
FIG. 8 is a perspective view showing the structure of a personal computer as an example of an electronic apparatus of the present invention.

An example of applying the matrix display device according to the present embodiment to a mobile type personal computer will be explained. FIG. 8 is a perspective view showing the structure of this personal computer. In the figure, a personal computer 1100 is composed of a main body 1104 which is provided with a keyboard 1102, and matrix display unit 1106. This matrix display unit 1106 comprises a matrix display panel 100.

(2) Mobile Phone

Figure 9:
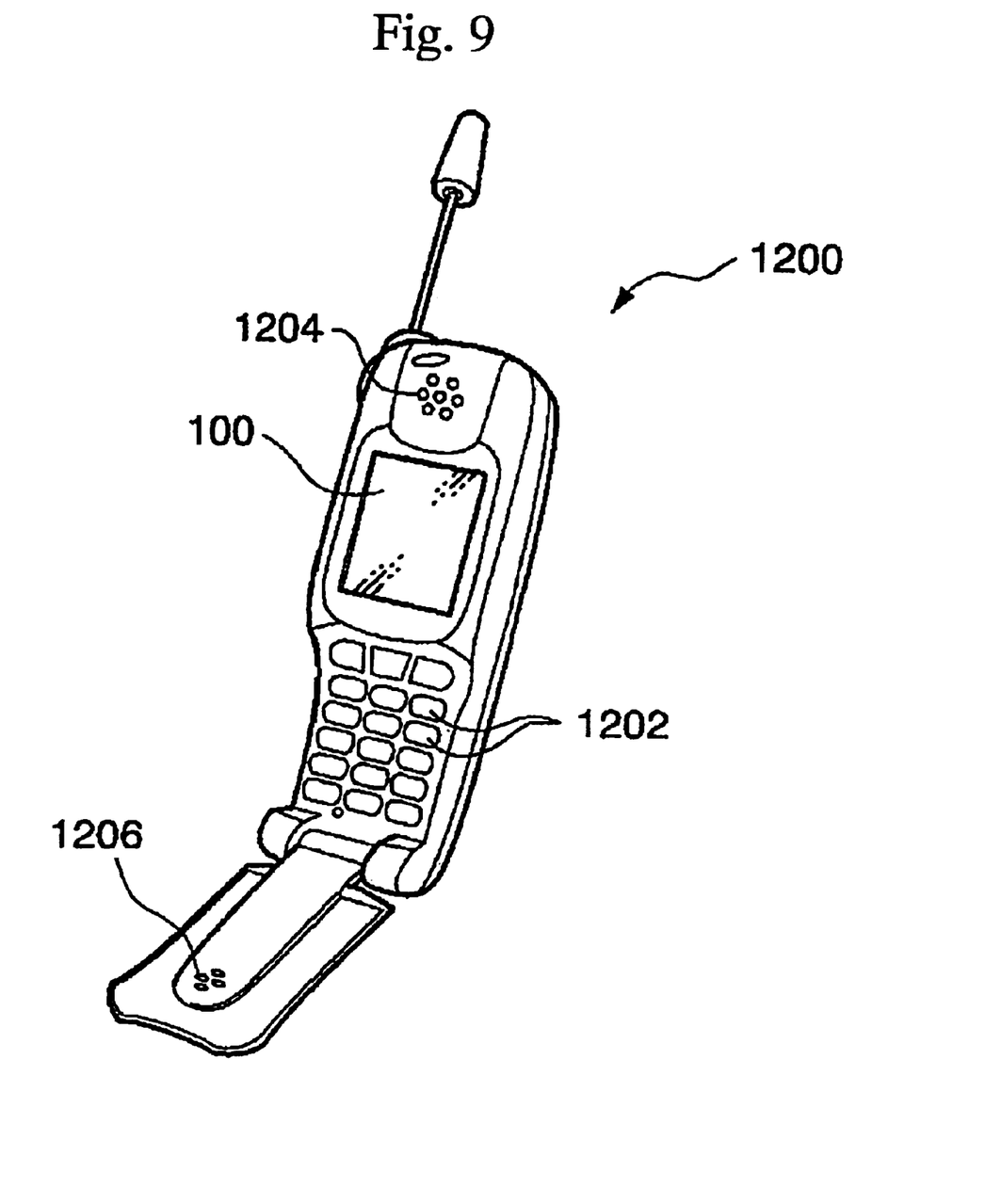
FIG. 9 is a perspective view showing the structure of a mobile phone as another example of the electronic apparatus of the present invention.

Next, an example of applying the matrix display device to a display part of a mobile phone will be explained. FIG. 9 is a perspective view showing the structure of this mobile phone. In the figure, a mobile phone 1200 comprises a plurality of operating buttons 1202, as well as an ear piece 1204, a mouth piece 1206, and the matrix display panel 100 as described above.

(3) Digital Still Camera

Figure 10:
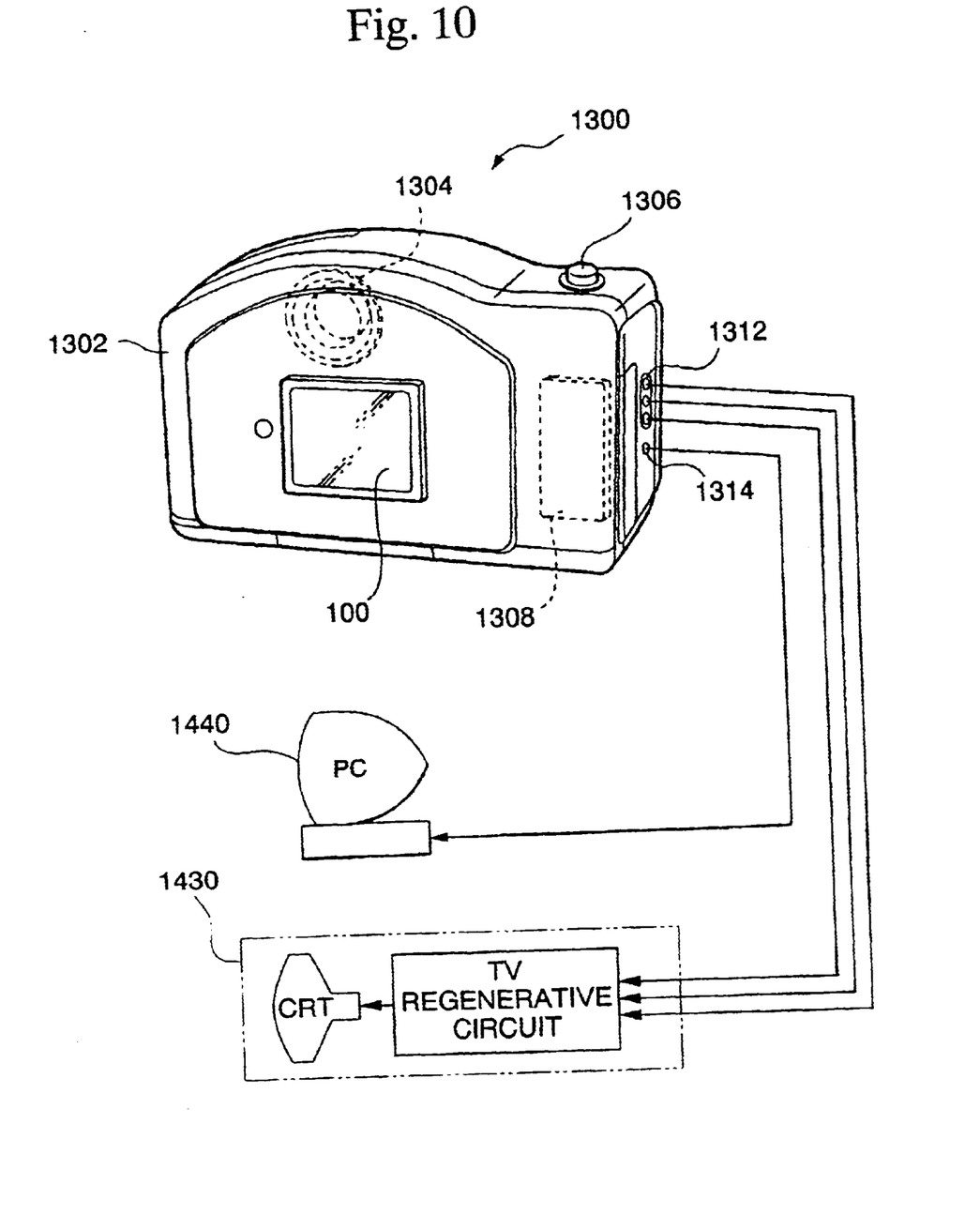
FIG. 10 is a perspective view showing the structure of the backside of a digital still camera as another example of the electronic apparatus of the present invention.

Furthermore, a digital still camera using a matrix display device as a finder will be explained. FIG. 10 is a perspective view showing the structure of this digital still camera and also simply shows connection with external units.

An ordinary camera exposes film using the light image of the subject, whereas, a digital still camera 1300 generates imaging signals by photoelectric-conversion of the light image of the subject using imaging elements such as a CCD (Charge Coupled Device) and the like. The display panel 100 as described above is provided on the back of a case 1302 of the digital still camera 1300 and carries out the display based on imaging signals by the CCD. As a result, the display panel 100 acts as a finder which displays the subject. Furthermore, a light receiving unit 1304 comprising an optical lens, CCD, and the like is provided at the observing side (back side in the figure) of the case 1302.

When a photographer confirms the subject image displayed on the display panel 100 and pushes a shutter button 1306, the imaging signals of the CCD at that point in time are transferred to and stored in the memory of a circuit board 1308. Furthermore, in this digital still camera 1300, a video signal output terminal 1312 and an input/output terminal for data communication 1314 are provided on the side of the case 1302. As shown in the figure, a television monitor 1430 is connected to the video signal output terminal 1312 and a personal computer 1430 is connected to the input/output terminal for data communication 1314, each according to necessity. Furthermore, by a predetermined operation, an imaging signal stored in the memory of the circuit board 1308 is output to the television monitor 1403 or the personal computer 1440.

In addition to the personal computer of FIG. 8, the mobile phone of FIG. 9, and the digital still camera of FIG. 10, examples of the electronic apparatus also include a liquid crystal television, a viewfinder type or direct-monitor type video tape recorder, a car navigation system, a pager, a personal data assistant, a calculator, a word processor, a work station, a video telephone, a POS (Point of Sale) terminal, a device having a touch panel, and the like. Obviously, the above-mentioned display device can be applied as a display section of these various types of electronic apparatuses.

Furthermore, the present invention is not limited to the above-mentioned embodiments, and various modifications are possible as long as they do not depart from the object of the present invention.

EXAMPLES

The present invention will be explained in detail with reference to the examples as follows.

Example 1

As a pretreatment, a glass substrate was cleaned by being irradiated with UV rays having a wavelength of 172 nm at 10 mW for ten minutes. Next, in order to form a lyophobic self-organizing film on the whole surface of the substrate, the glass substrate and 0.5 ml of tridecafluoro-1,1,2,2-tetrahydrooctyltriethoxysilane were put in a sealed container and left to stand for 48 hours at room temperature, thereby forming a self-organizing film, which has fluoroalkyl groups on its surface, on the glass substrate. Subsequently, UV rays having a wavelength of 172 nm were radiated at 10 mW for ten minutes through a photomask having a predetermined pattern, and then only the parts of the self-organizing film not covered with the photomask were selectively removed to form a lyophilic region and a lyophobic region.

The details of the photomask used will be explained below. Using quartz, the substrate transmits approximately 60% of UV rays having a wavelength of 172 nm. The substrate has a lined pattern called "line and space" with a line width of 30 $\mu$m and a distance between adjacent lines of 20 $\mu$m. The pattern is formed by a chrome film which blocks the UV rays. Furthermore, for adjusting the position when droplets are applied by an ink jet method to be described below, four alignment marks are provided at the peripheral part of the photomask.

Next, in order to form the second self-organizing film having thiol groups on the surface of the film on the lyophilic region formed by removing the lyophobic self-organizing film, the above substrate was soaked in a 2% ethanol solution of 3-mercaptopropyltriethoxysilane for five minutes, and was subsequently washed with ethanol. As a result, a self-organizing film having thiol groups on its surface was formed on only the lyophilic region.

Next, a solution with fine particles of gold having a particle diameter of 10 nm dispersed in α-terpineol (trade name: "PERFECT GOLD" manufactured by Vacuum Metallurgical Co., Ltd.) was spin-coated on a substrate patterned with a lyophilic region and a lyophobic region. As a result, the solution remained only on the lyophilic region, and did not remain on the lyophobic region. After this substrate was baked at 300° C. for 15 minutes in air (atmosphere), the solution coated on the lyophilic region became a thin film of gold, and a lined pattern of a gold thin film with a line width of 30 $\mu$m according to the pattern of the above photomask was formed. This gold thin film had a film thickness of 0.5 $\mu$m and a specific resistance of $2 \times 10^{-5}$ $\Omega$cm.

Example 2

After a glass substrate was cleaned using the same steps as Example 1, a lyophobic self-organizing film having fluoroalkyl groups on its surface, was formed on the whole surface of the substrate using heptadecafluoro-1,1,2,2-tetrahydrodecyltriethoxysilane as the material for forming the lyophobic self-organizing film, using the same steps as Example 1. Subsequently, UV irradiation was carried out through the same photomask used in Example 1 to form a pattern having a lyophobic region and a lyophilic region.

Next, in order to form the second self-organizing film, having amino groups on its the surface, on the lyophilic region, the substrate was soaked in a 2% ethanol solution of 3-aminopropyltriethoxysilane for five minutes, and subsequently, the substrate was washed with ethanol. As a result, the self-organizing film, having amino groups on its surface, was formed on only the lyophilic region.

A silver fine particle dispersion solution to be applied to the lyophilic region on the substrate formed by the above steps was prepared as follows. First, 90 mg of silver nitrate was dissolved in 500 ml of water and the solution was heated to 100° C. Furthermore, 10 ml of a 1% concentrated sodium citrate solution was added to the solution while stirring, and boiled for 80 minutes. Accordingly, a solution was obtained in which a silver colloid covered by citric acid for preventing aggregation was dispersed. This silver colloid had an average particle diameter of 30 nm. After this solution was concentrated by centrifugation, water and a surface tension adjusting material were added to the concentrated solution in order to make an ink, and the viscosity and surface tension were adjusted so as to be able to jet out the ink by an ink jet head.

The pattern was drawn by the fine particle dispersion solution which was made into ink according to lines of the lyophilic region formed on the substrate using a commercial printer (trade name: "MJ930C") head as the ink jet head. In this case, the positioning accuracy of jetting out was approximately 30 μm. Although there were droplets jetted out which came out of the lines of the lyophilic region of 30 μm width, since the portions outside of the lines had a lyophobic property, all of the droplets coming out of the lyophobic region moved to the lyophilic region, and therefore, the solution was selectively applied only on the lines of the lyophilic region. After drying for one hour at room temperature, a solid silver colloid was deposited only on the lines of the lyophilic region. However, since the surface of the silver colloid was covered with organic matter, the silver colloid showed a coppery luster, and there was almost no electric conduction.

Furthermore, after irradiating the substrate using a 500 W xenon lamp for 60 seconds, the organic matter on the surface of the silver colloid was removed to form a conductive pattern having a silver luster. This film had a film thickness of approximately 0.1 μm and a specific resistance of approximately $5 \times 10^{-4}$ Ωcm.

What is claimed is:

1. A method for forming a conductive film pattern, comprising the steps of:

forming a predetermined pattern having a lyophilic region and a lyophobic region using an organic molecular film on a surface of a substrate;

selectively applying a solution comprising conductive fine particles to the lyophilic region; and converting the solution applied to the lyophilic region into a conductive film by a heat treatment.

2. The method for forming a conductive film pattern according to claim 1, the organic molecular film being a self-organizing film.

3. The method for forming a conductive film pattern according to claim 1, the lyophobic region being formed on a surface of the substrate using a self-organizing film composed of a compound comprising a fluoroalkyl group.

4. The method for forming a conductive film pattern according to claim 1, the lyophilic region being formed on a surface of the substrate using a self-organizing film comprising a thiol group, an amino group, or a hydroxyl group.

5. The method for forming a conductive film pattern according to claim 1, the conductive fine particles being metal fine particles comprising at least one selected from the group of gold, silver, copper, palladium, and nickel.

6. The method for forming a conductive film pattern according to claim 1, a step for applying the solution to the lyophilic region being carried out by a spin-coating method.

7. The method for forming a conductive film pattern according to claim 1, a step for applying the solution to the lyophilic region being carried out by a method of applying droplets of the solution to a desired position by an ink jet device.

8. An electro-optical device comprising a conductive film pattern formed by a method for forming a conductive film pattern according to claim 1.

9. An electronic apparatus comprising an electro-optical device according to claim 8.

* * * * *

UNITED STATES PATENT AND TRADEMARK OFFICE
CERTIFICATE OF CORRECTION

PATENT NO. : 6,734,029 B2
DATED : May 11, 2004
INVENTOR(S) : Masahiro Furusawa

It is certified that error appears in the above-identified patent and that said Letters Patent is hereby corrected as shown below:

<u>Title page,</u>
Item [56], References Cited, U.S. PATENT DOCUMENTS, add
-- 4,256,778  3/1981  Mizukami et al --

<u>Column 1,</u>
Line 46, after "use" insert -- of --

<u>Column 2,</u>
Line 10, delete "a"

<u>Column 10,</u>
Line 50, delete "its"

Signed and Sealed this

Eighteenth Day of January, 2005

JON W. DUDAS
*Director of the United States Patent and Trademark Office*